SOLID BACKED THERMOPILE

Filed May 25, 1965

INVENTOR.
PHILIPPE VILLERS
BY
ATTORNEY 3,436,274
SOLID BACKED THERMOPILE

Philippe Villers, Wilton, Conn., assignor to Barnes Engineering Company, Stamford, Conn., a corporation of Delaware Filed May 25, 1965, Ser. No. 458,736
Int. Cl. H01v *1/02*
U.S. Cl. 136—224 6 Claims

ABSTRACT OF THE DISCLOSURE

A thermopile is described responding to electromagnetic radiation comprising a substrate of material of high thermal diffusivity, sufficiently thick to form a heat sink, the material being transparent to radiations for which the thermopile is to be used. The substrate is provided with raised and depressed areas forming ridges and grooves, the raised areas either being part of the substrate itself or other material of high thermal conductivity. A thin film of electrically insulating material is stretched across the substrate bridging across the grooves, and thermopiles are formed on the side of the film opposite the heat sink, the active junctions being on the portions over the grooves and the inactive junctions over the ridges. The film bridging the grooves is blackened in the area underneath the active junctions. The thermopile responds to radiation passing through the substrate or directly irradiating the active junctions, or both.

Background of the invention

Thermopiles have achieved extensive success as radiation detectors, particularly in the infrared. In general, thermopiles for use as radiation detectors have a series of active and passive junctions mounted, for example by vacuum deposition, on a sheet of material, preferably of low heat conductivity.

Improved thermopiles have been proposed in which a sheet of material of low heat conductivity is mounted on a heat sink, such as, for example, a block of aluminum, the thin sheet being in contact with the aluminum over the area occupied by the passive junctions, and the area on which the active junctions are mounted is not in contact with the heat sink, either by reason of a recess or a groove, or an actual opening. The active junctions are blackened in order to increase their absorption for radiation, and in general blackening is needed for thermopiles which are to be used for radiation detectors. The inactive junctions are, of course, shielded from radiation.

In the copending application of Villers and Falbel, Ser. No. 458,737 filed May 25, 1965, and assigned to the assignee of the present invention, there is described an improved thermopile in which radiation is absorbed on one side of the thin sheet of insulating material and the junctions on the other side. This has permitted a complete separation of the thermal portion of the thermopile and the electrical portion, so that each can be designed for optimum properties and no compromise is necessary. The sheet is, of course, mounted on a suitable substrate with openings opposite the areas on which the active junctions are situated.

Certain other instruments have been designed using thermopiles, in which a separate heat source, preferably thermostated, is used as an offset to compensate for radiation from the active junctions of the thermopile to colder environments in a typical instance, space vehicles, radiation to space. The use of an offset heat source, however, obscures a portion of the beam of incoming radiation, and to that extent reduces the sensitivity of the thermopile.

It would be desirable for certain purposes to use an offset heat source in back of the thermopile, and absorb radiations from it, somewhat along the lines of the Villers and Falbel application referred to above. There are also other uses in which a thermopile which can receive radiation on either side is desirable.

With solid-backed thermopiles this presents a problem, as, of course, the heat sink is usually not transparent to the radiation which is to be received and so has to be provided with openings through which the radiation can pass. This is particularly a problem with rectangular thermopiles, especially those with a large number of elements, such as more than 300, as it is necessary to form openings in the form of slots, and this reduces the mechanical strength of the substrate, which is used a a heat sink, and also increases the cost of manufacture very markedly.

Summary of the invention

It is with the solution of the above problems that the present invention deals, and essentially in the present invention, there is used a heat sink in the form of a transparent substrate. This may be of material such as fused aluminum oxide, which is loosely referred to as sapphire, or it may be a material such as germanium or silicon, which transmit infrared radiations over considerable ranges. The portions of the heat sink over which the active junctions lie are formed as recesses, grooves in the case of a rectangular thermopile.

This can be effected in various ways, for example, shallow grooves can be machined into the heat sink, but as germanium and silicon, which are important materials, are quite brittle, this method of manufacture is less attractive, although not excluded from the present invention. In the case of germanium and silicon, which are electrically conductive, the grooves can be formed by electraforming or otherwise depositing metals in the form of low ridges which define shallow grooves between them. Such ridges should be of material of good thermal conductivity, so that the inactive junctions can conduct heat readily from the insulating layer to the heat sink. For this purpose, and for other manufacturing reasons, silver and gold are the preferred materials. The invention, however, is not limited thereto, as other materials which can be deposited or electroformed in ridges and which are of high thermal conductivity may also be employed, such as aluminum, copper and the like.

Over the heat sink with depressions there is stretched a thin sheet of material of poor thermal conductivity. The present invention is not limited to any particular material of which the sheet may be formed, but because of its attractive characteristics and mechanical strength, sheets of polyglycol terephthalate are preferred. These are generally sold in the trade under the name "Mylar" and for brevity this trade name will be used in the remainder of the specification.

Because in a thermopile, in contradistinction to a bolometer, the responsivity is practically not affected by the thickness of the layer of poor thermal conductivity, it is usually desirable to use a sheet as thin as is possible while still retaining sufficient mechanical strength to support the junctions of the thermopile. Typical thicknesses for Mylar range from .12 to .25 mil. The areas over the grooves or depressions are blackened, if desired in certain cases, by depositing first a thin film of a material of high diffusivity, such as, for example, a thin film of gold, on which the blackening is then deposited. This may be of various materials, such as gold or platinum black, or, for use in the very far infrared, blackening of very small silicon carbide particles. There has to be a narrow zone or band between the portion of the Mylar over the center of the grooves and that in contact with the ridges or raised portions of the heat sink. This constitutes a thermal gap, and prevents thermally short-circuiting the thermopile.

On the other side of the Mylar sheet are deposited the active and passive junctions of the thermopile. A very practical pair of junction materials is antimony and bismuth, which can be deposited in very thin films, for example 1$\mu$ and 3$\mu$ respectively, but of course other thermoelectric materials may be used to form junctions, such as, for example, germanium and silicon. In certain cases the feature of the Villers and Falbel application above referred to may be included and the gap made slightly wider than the lengths of the leads from active to passive junctions to compensate for minute errors in registration of the thermocouple junctions.

The thermopile of the present invention can therefore receive radiation from either side, or both sides, from different sources. At the same time the manufacture is greatly simplified, a reproducible, uniform and also rugged construction is obtained, because there is a unitary block forming the heat sink that has not been weakened by cut-out portions such as a series of slots. This advantage is greater with rectangular thermopiles than with radial thermopiles, but is an advantage even in the latter case. In the more specific description which follows, rectangular thermopiles will be described, but it should be understood that the invention is not limited to this particular configuration.

The heat sink may be a pure window, preferably with suitable optically flat surface on the side opposite the Mylar sheet. It is also possible for the heat sink to be in the form of a lens. The particular shape of the transparent heat sink does not, per se, form any part of the present invention, but it is an advantage that special shapes which may be desirable for certain uses can be made.

The present invention is directed to a practical instrument and the term "transparent" is used in its ordinary practical sense, as transmitting substantial amounts of the radiation to which it is transparent. Theoretically there is no perfectly transparent medium except a vacuum, and no perfectly opaque medium, even metals, which in heat sink thicknesses may have transmissions of one part in billions or quadrillions.

Description of the preferred embodiments

Figure 2:
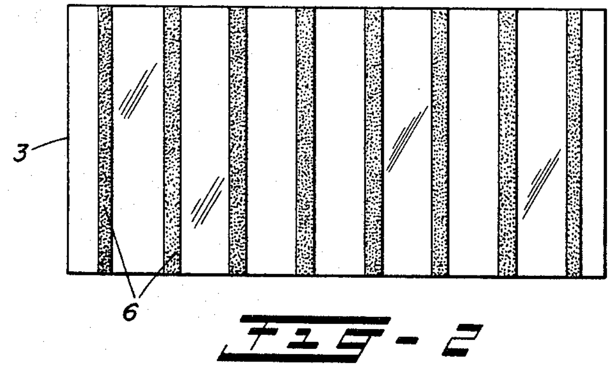
FIG. 2 is a plan view of the rear of the Mylar sheet.
Figure 3:
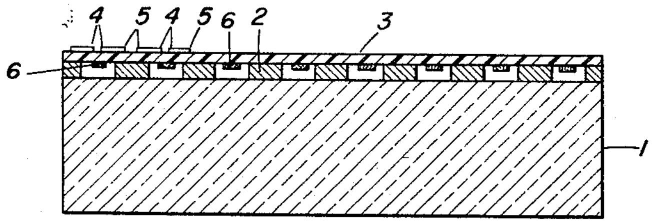
FIG. 3 is a cross section through a thermopile mounted on a transparent substrate, the section being along the lines 3—3 of FIG. 1.

The thermopile is mounted on a transparent substrate, for example silicon, shown at 1 in FIG. 3. On the substrate there are formed ridges 2 of high conductivity metal such as gold with recesses between them. Across the ridges is stretched a thin Mylar sheet 3 of 0.25 mil. This sheet of course bridges across the recessed portions between the ridges, and blackened strips 6 are shown in FIGS. 2 and 3 on the side of the sheet toward the substrate. For clarity, the Mylar sheet and the gold ridges are very greatly exaggerated. In an actual thermopile the ridges may be of the order of magnitude of a mil or less.

Figure 1:
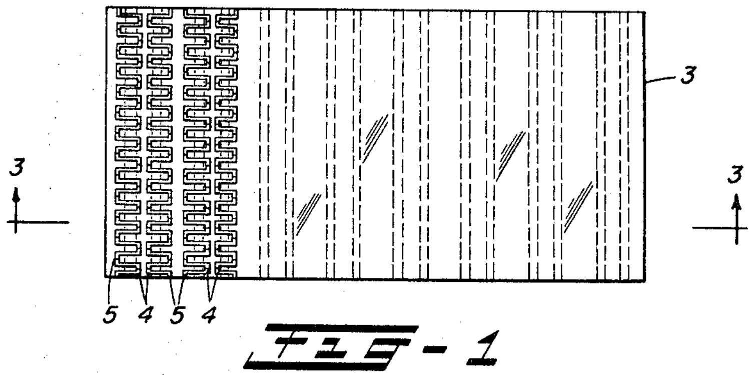
FIG. 1 is a plan view of the top of the Mylar sheet with thermopile junctions.

On the other side of the Mylar sheet are deposited the junctions of thermopile in rows. These junctions are deposited in the conventional manner, successively through masks, first depositing one metal, for example, antimony, and then the other, for example bismuth. It will be seen from FIG. 1 that the active junctions 4 are wholly over the blackened areas 6, and that the passive junctions 5 are over an area which is in contact with the ridges.

As in all thermopiles, the end junctions are provided with leads, but since this is not affected by the present invention, the leads are not shown. The thermopile may be used in any suitable environment such as air, vacuum, and the like, and since the grooves are open at their ends, they are filled with the material of the environment, that is to say, air in the case of air operation, or empty in the case of vacuum operation. The thermopile can receive radiation from either side, or from both sides simultaneously, depending on the nature of the instrument in which the thermopile is to be used. Radiation going through the substrate does not strike the passive junctions because the ridges of gold are radiation opaque. The passive junctions are also left unblackened and effectively at heat sink temperature, but as this is conventional, it has not been shown in FIG. 1, in order to make the drawing clearer. Similarly, the active junctions have to be blackened, but as this is conventional, the blackening is not shown in FIG. 3.

The specific description is in conjunction with the preferred type of the present invention, in which the grooves are formed by deposited ridges, and the configuration is that of a rectangular thermopile. The grooves can, of course, be made by machining in the substrate itself, and the grooves may be in the form of a circular depression if a radial type of thermopile is desired. In such a case, there will be a channel to the central groove or other provisions for venting to permit operation in a vacuum.

I claim:

1. A thermopile of the solid-backed type for detecting electromagnetic radiation comprising, in combination, (a) a substrate of high diffusivity and constituting a heat sink, said substrate being transparent to the radiation to be detected, (b) areas on said substrate of different elevations forming raised portions and recessed portions between them, (c) a thin film of material of low thermal conductivity stretched across said substrate and bridging the recessed portions, and (d) thermopile junctions on the opposite side of the film comprising active and passive junctions, the active junctions being located on the other side of the film immediately over the recessed portions, and the passive junctions being on zones of the sheet which are in contact with the raised portions of the substrate.

2. A thermopile according to claim 1 in which the areas of the side of the film of low thermal conductivity beneath the active junctions and over the recessed portions of the substrate are coated with radiation absorbing material.

3. A thermopile according to claim 2 in which the areas of different elevation on the substrate comprise ridges of metals of high heat conductivity on said substrate, defining between them recessed areas.

4. A thermopile according to claim 2 in which the film is of polyglycol terephthalate.

5. A thermopile according to claim 2 in which the substrate is composed of germanium.

6. A thermopile according to claim 2 in which the substrate is composed of silicon.

References Cited

UNITED STATES PATENTS 3,293,082 12/1966 Brouwer et al. ........ 136—230

WINSTON A. DOUGLAS, *Primary Examiner.*

MELVYN J. DOUGLAS, *Assistant Examiner.*